(12) United States Patent
Cheng et al.

(10) Patent No.: US 10,867,849 B2
(45) Date of Patent: Dec. 15, 2020

(54) PACKAGE-ON-PACKAGE STRUCTURE

(71) Applicant: Taiwan Semiconductor Manufacturing Co., Ltd., Hsinchu (TW)

(72) Inventors: Li-Hui Cheng, New Taipei (TW); Chin-Fu Kao, Taipei (TW); Chih-Yuan Chien, Hsinchu County (TW); Szu-Wei Lu, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/714,822

(22) Filed: Dec. 16, 2019

(65) Prior Publication Data

US 2020/0144110 A1 May 7, 2020

Related U.S. Application Data

(62) Division of application No. 16/103,937, filed on Aug. 15, 2018, now Pat. No. 10,510,591.

(60) Provisional application No. 62/691,623, filed on Jun. 29, 2018.

(51) Int. Cl.
| | |
|---|---|
| *H01L 21/768* | (2006.01) |
| *H01L 23/00* | (2006.01) |
| *H01L 21/56* | (2006.01) |
| *H01L 21/3213* | (2006.01) |
| *H01L 23/31* | (2006.01) |
| *H01L 21/02* | (2006.01) |

(52) U.S. Cl.
CPC .. *H01L 21/76871* (2013.01); *H01L 21/02592* (2013.01); *H01L 21/32133* (2013.01); *H01L 21/32139* (2013.01); *H01L 21/56* (2013.01); *H01L 23/3107* (2013.01); *H01L 24/09* (2013.01); *H01L 24/32* (2013.01); *H01L 2224/02372* (2013.01)

(58) Field of Classification Search
CPC ......... H01L 21/76871; H01L 21/02592; H01L 21/32133; H01L 21/32139; H01L 21/56; H01L 23/3107; H01L 24/09; H01L 24/32; H01L 2224/02372
USPC ....................................................... 257/686
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |

(Continued)

*Primary Examiner* — Tu-Tu V Ho
(74) *Attorney, Agent, or Firm* — JCIPRNET

(57) ABSTRACT

A package-on-package (PoP) structure includes a first package and a second package stacked on the first package. The first package includes a die, a plurality of conductive structures, an encapsulant, and a redistribution structure. The die has an active surface and a rear surface opposite to the active surface. The die includes an amorphous layer located on the rear surface. The conductive structures surround the die. The encapsulant encapsulates the die and the conductive structures. The redistribution structure is on the active surface of the die and is electrically connected to the conductive structures and the die.

20 Claims, 13 Drawing Sheets

(56) References Cited

U.S. PATENT DOCUMENTS

| | | |
|---|---|---|
| 9,368,460 B2 | 6/2016 | Yu et al. |
| 9,372,206 B2 | 6/2016 | Wu et al. |
| 9,496,189 B2 | 11/2016 | Yu et al. |
| 10,522,406 B2 * | 12/2019 | Dang ................. H01L 24/03 |

* cited by examiner

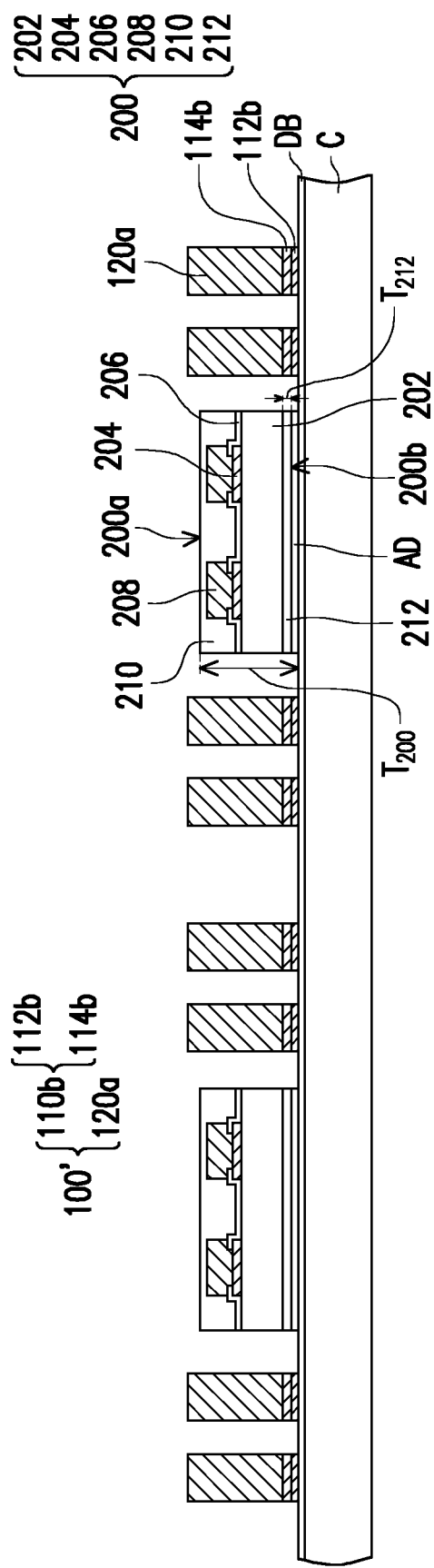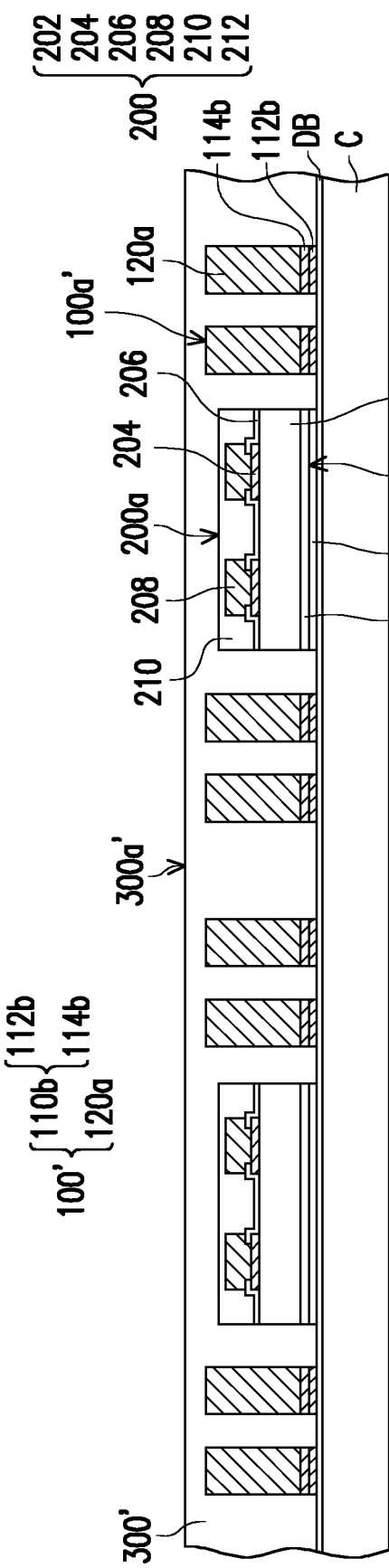

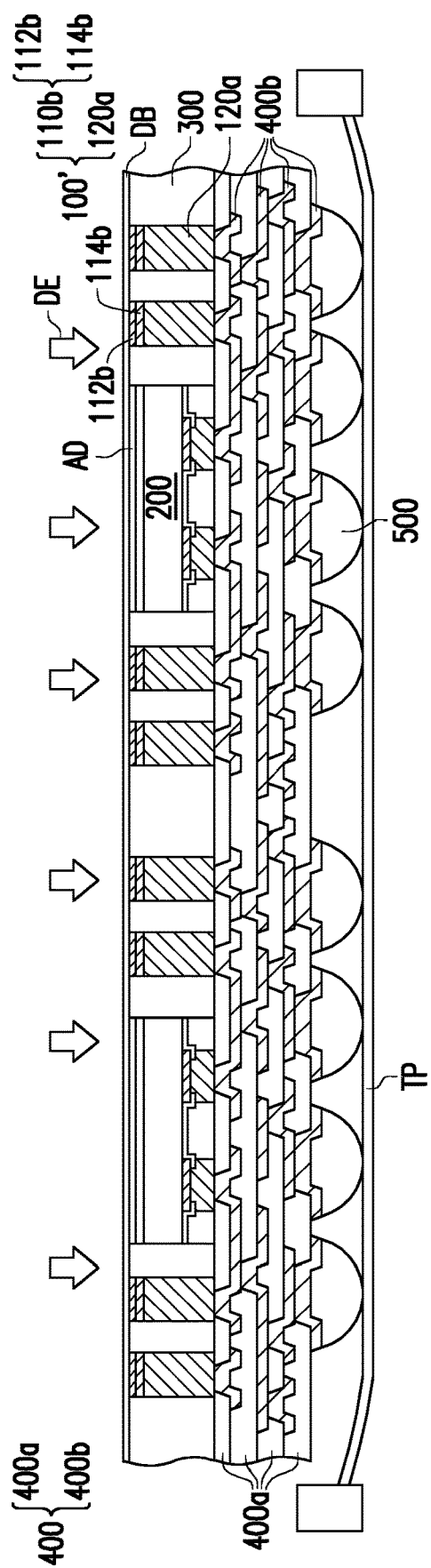
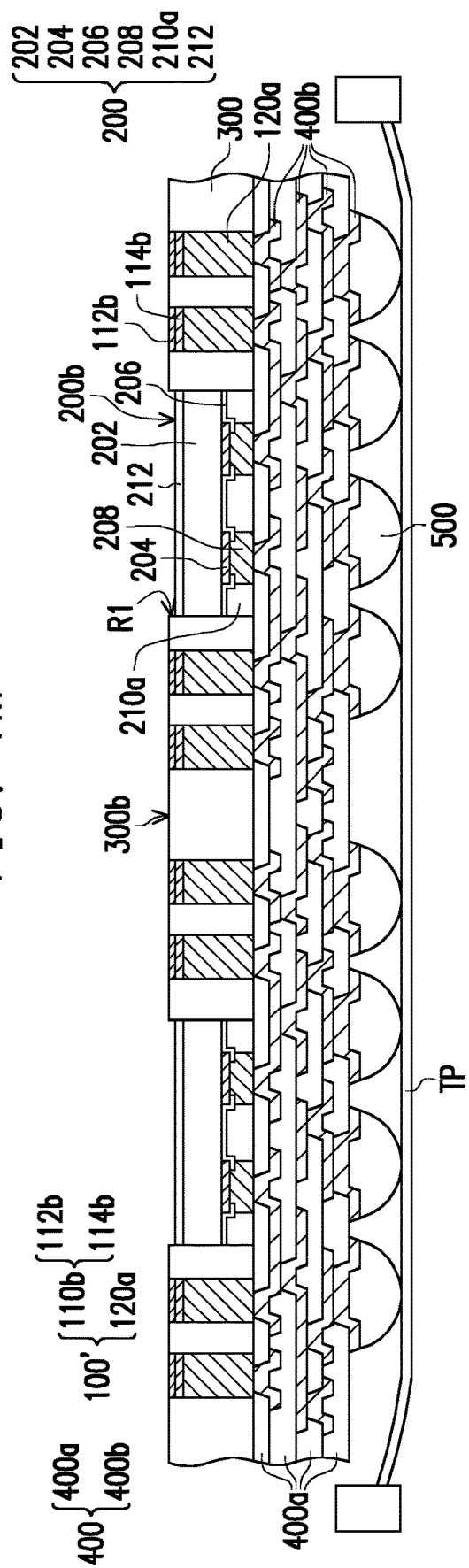
FIG. 1M
FIG. 1N

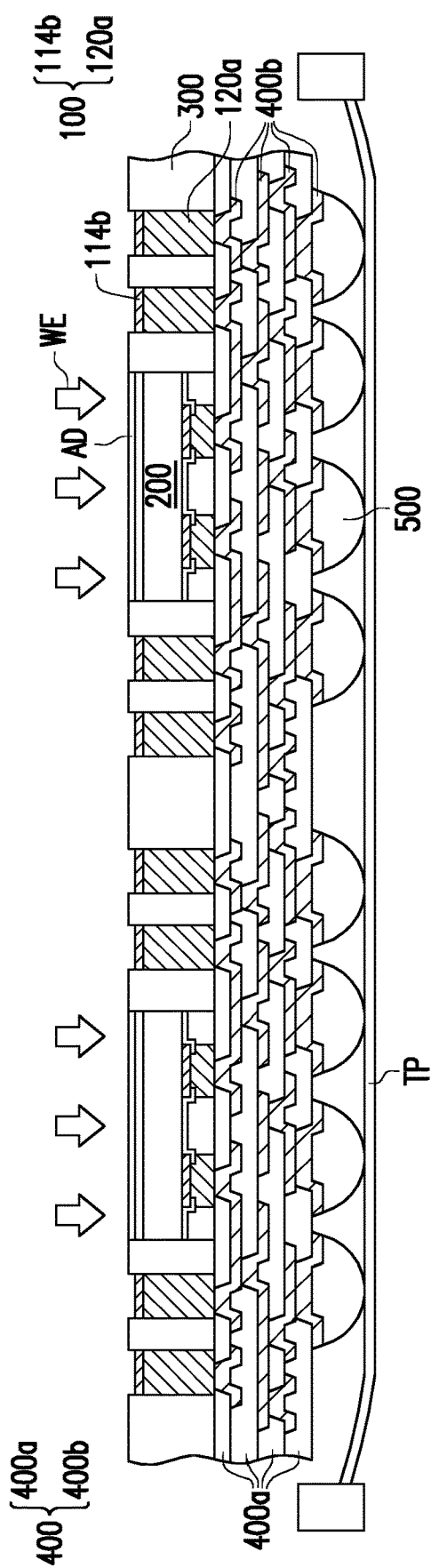
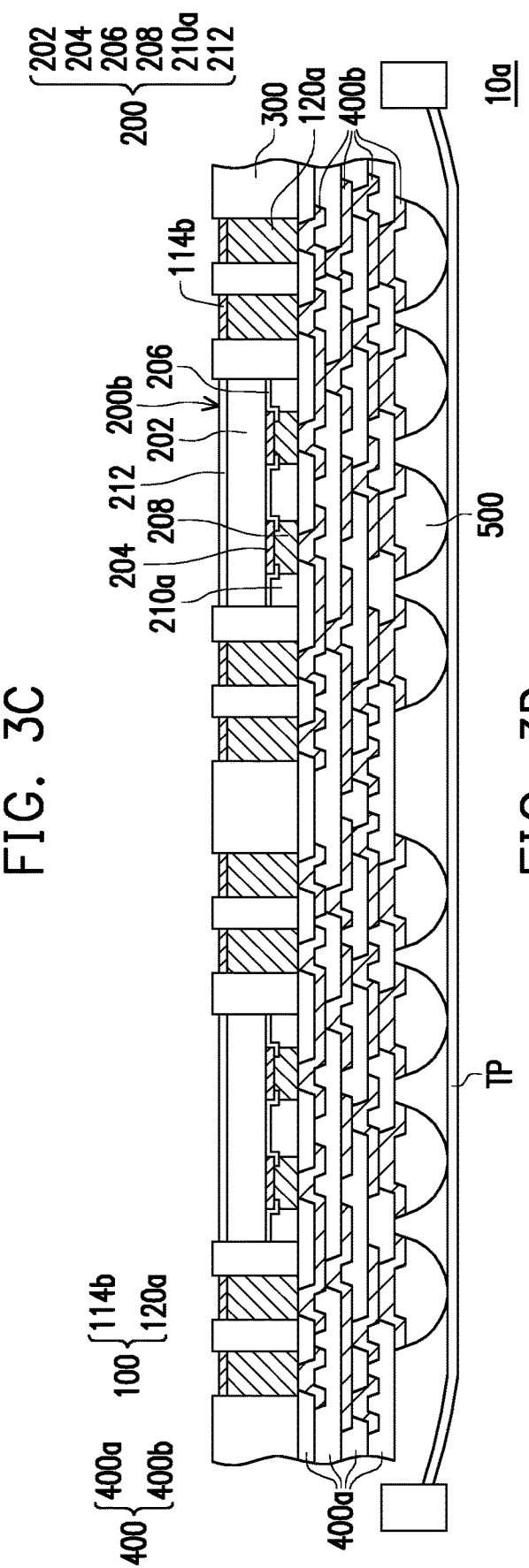
FIG. 3C
FIG. 3D

PACKAGE-ON-PACKAGE STRUCTURE

CROSS-REFERENCE TO RELATED APPLICATION

This application is a divisional application of and claims the priority benefit or a prior application Ser. No. 16/103,937, filed on Aug. 15, 2018. The prior application Ser. No. 16/103,937 claims the priority benefits of U.S. provisional application Ser. No. 62/691,623, filed on Jun. 29, 2018. The entirety of the above-mentioned patent applications are hereby incorporated by reference herein and made a part of this specification.

BACKGROUND

The semiconductor industry has experienced rapid growth due to continuous improvements in the integration density of various electronic components (e.g., transistors, diodes, resistors, capacitors, etc.). For the most part, this improvement in integration density has come from repeated reductions in minimum feature size, which allows more of the smaller components to be integrated into a given area. These smaller electronic components also require smaller packages that utilize less area than previous packages. Currently, integrated fan-out packages are becoming increasingly popular for their compactness. How to ensure the reliability of the integrated fan-out packages has become a challenge in the field.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 3A to FIG. 3D are schematic cross-sectional views illustrating a hybrid etching process of a manufacturing process of a PoP structure in accordance with some alternative embodiments of the disclosure.

DETAILED DESCRIPTION

Figure 1A:
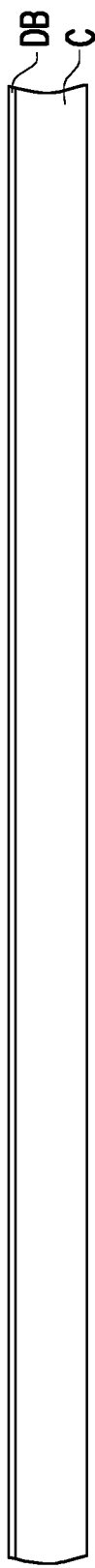
FIG. 1A to FIG. 1R are schematic cross-sectional views illustrating a manufacturing process of a package-on-package (PoP) structure in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Figure 1B:
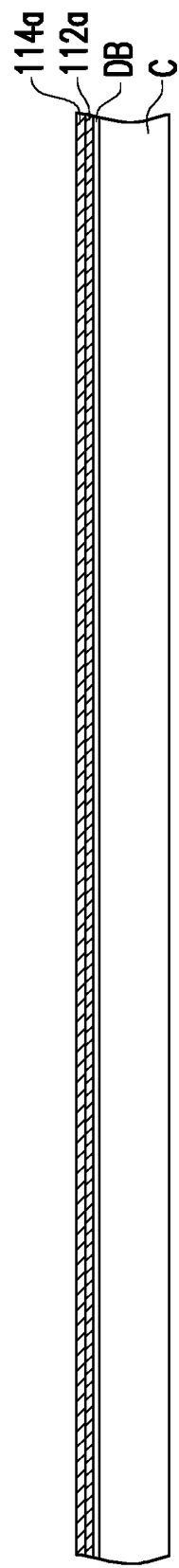
Figure 1C:
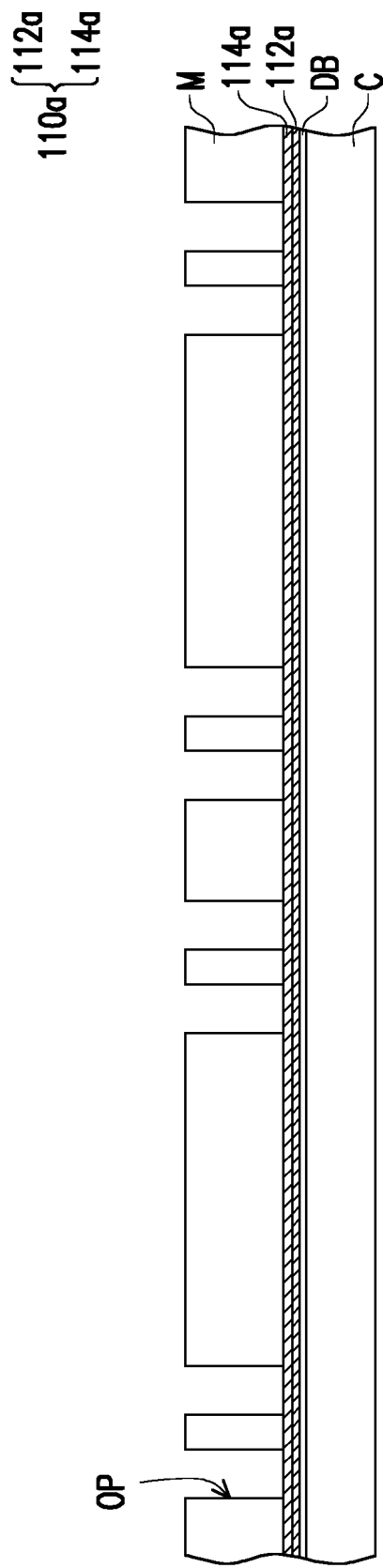
Figure 1D:
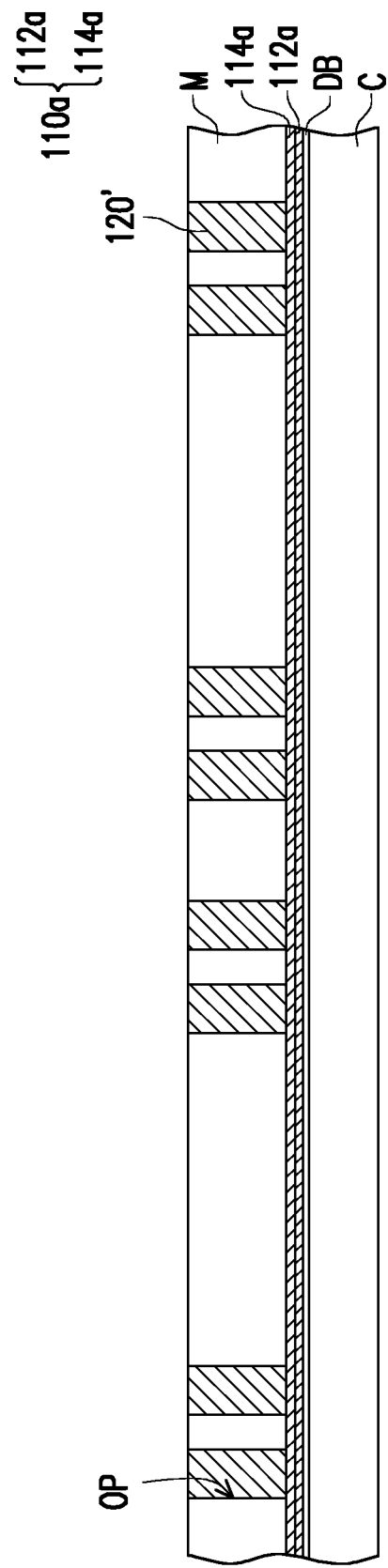
Figure 1E:
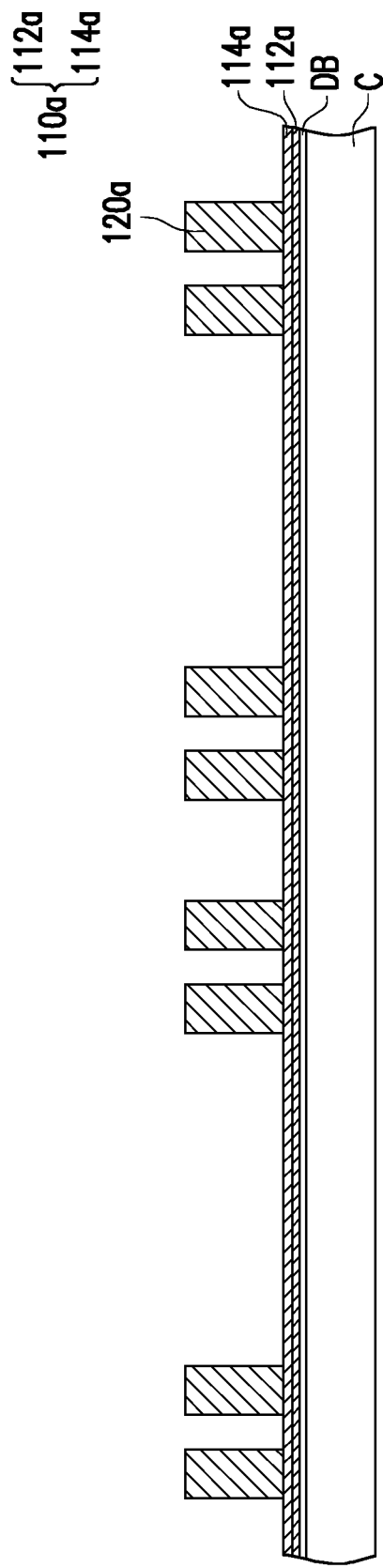
Figure 1F:
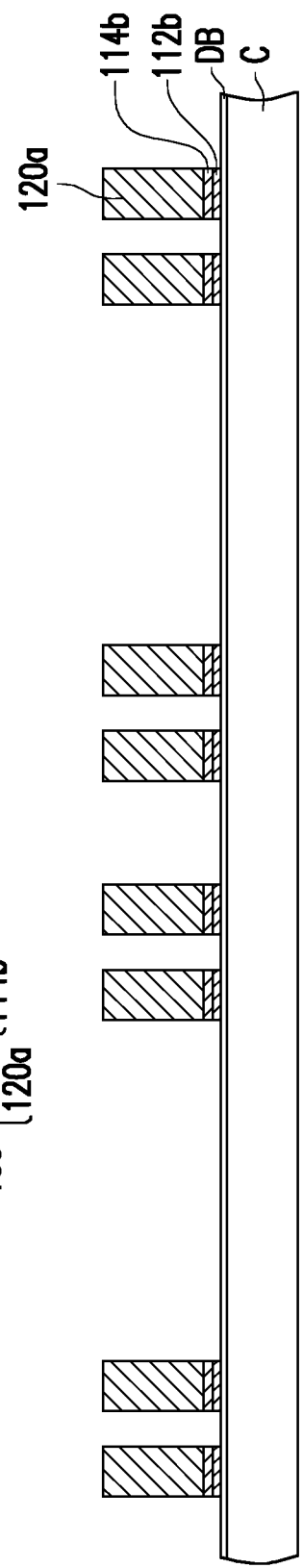
Figure 1I:
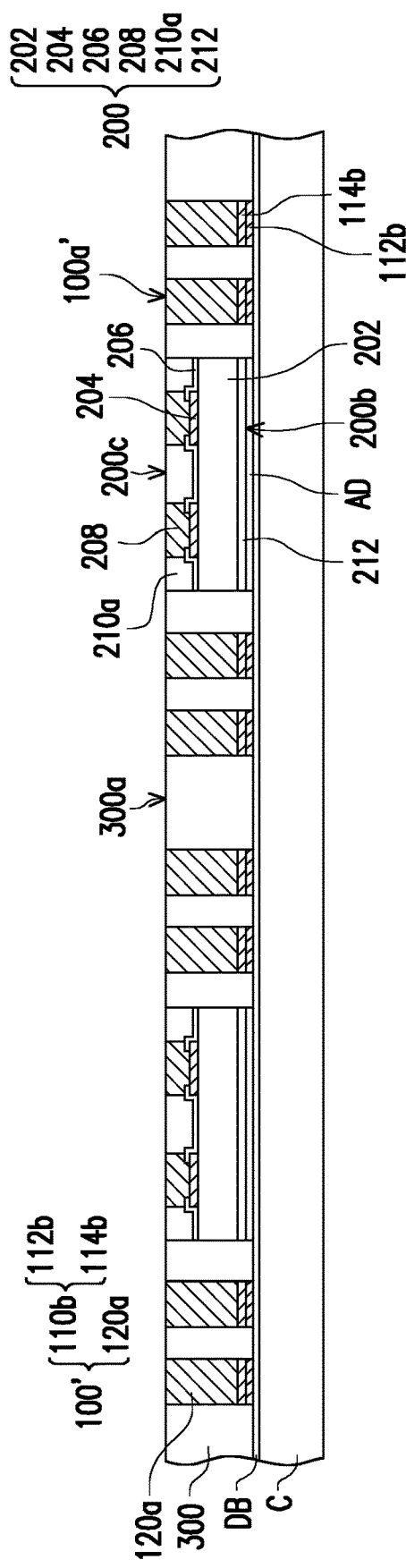
Figure 1J:
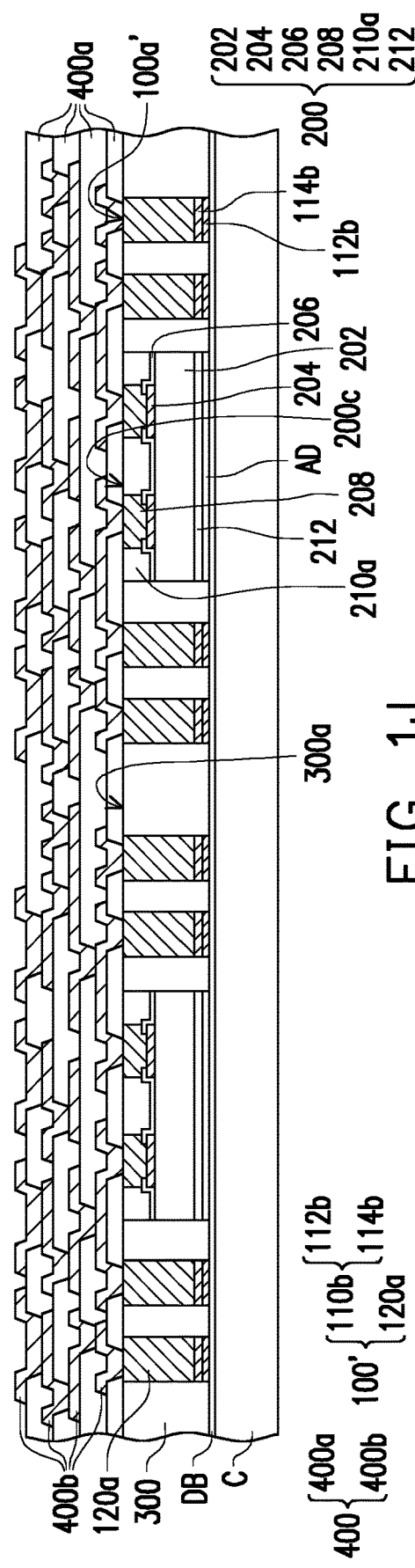
Figure 1K:
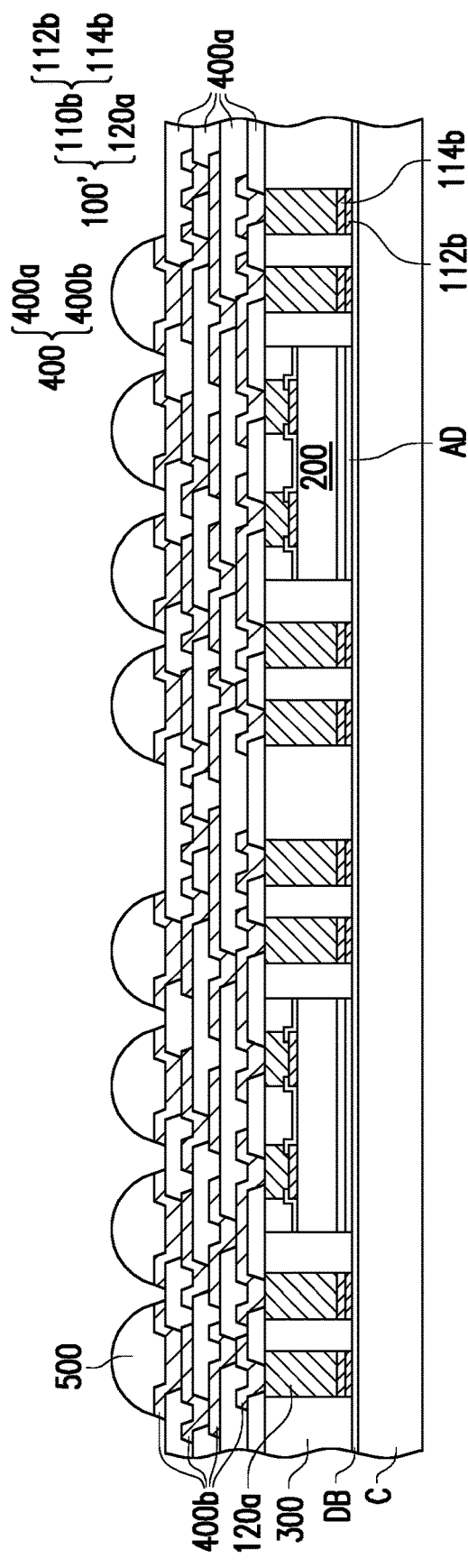
Figure 1L:
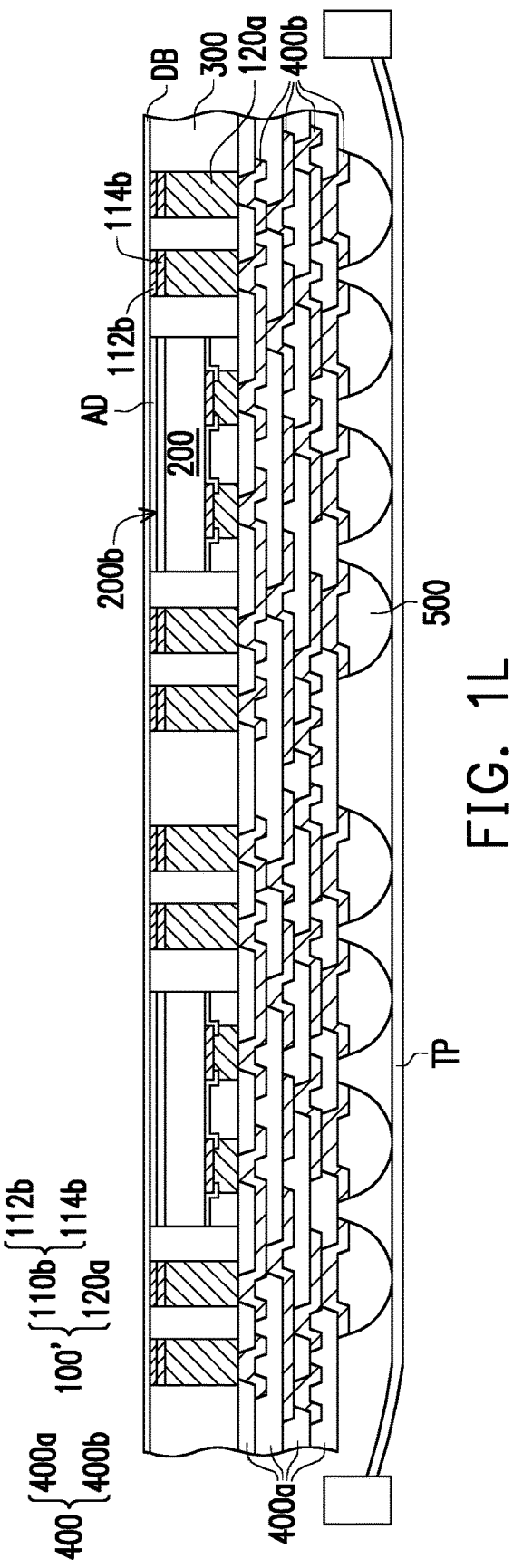
Figure 1O:
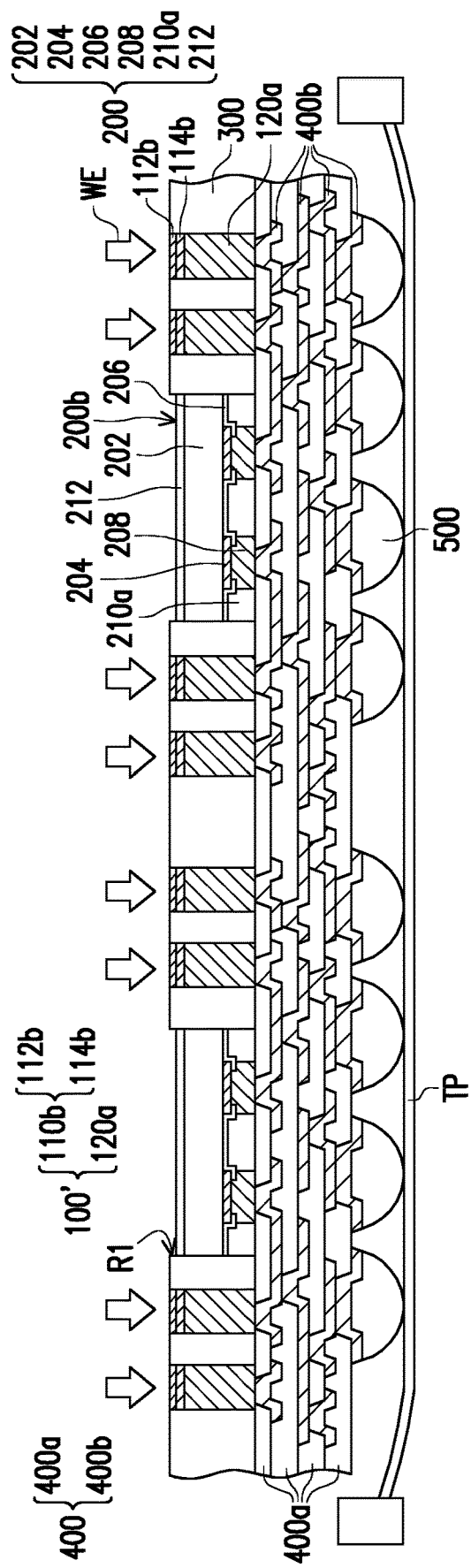
Figure 1P:
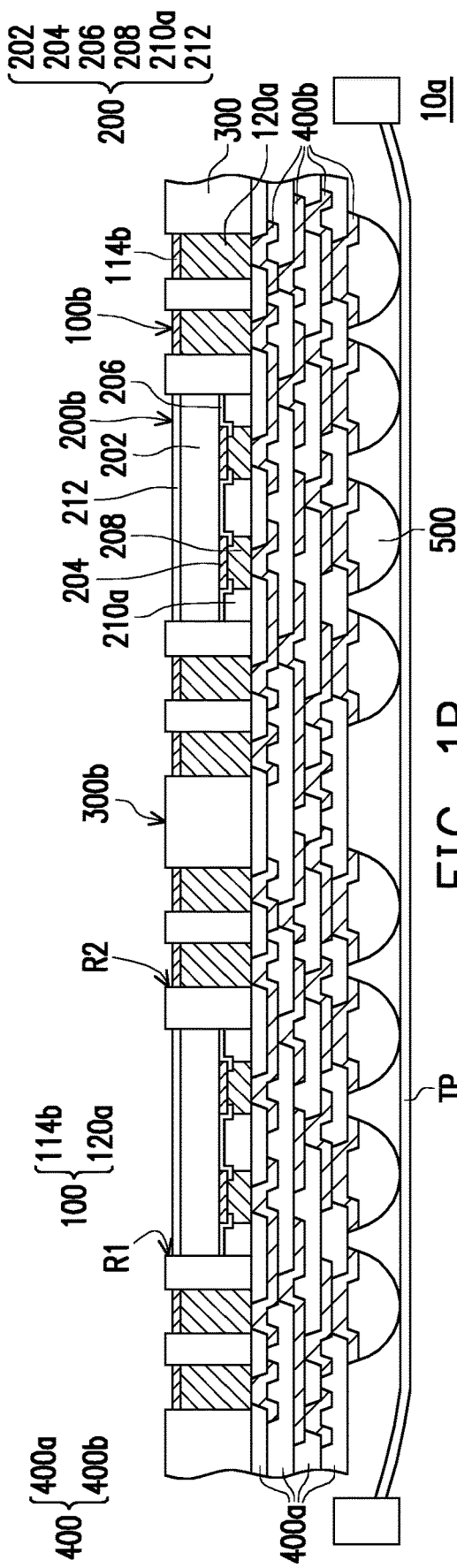
Figure 1Q:
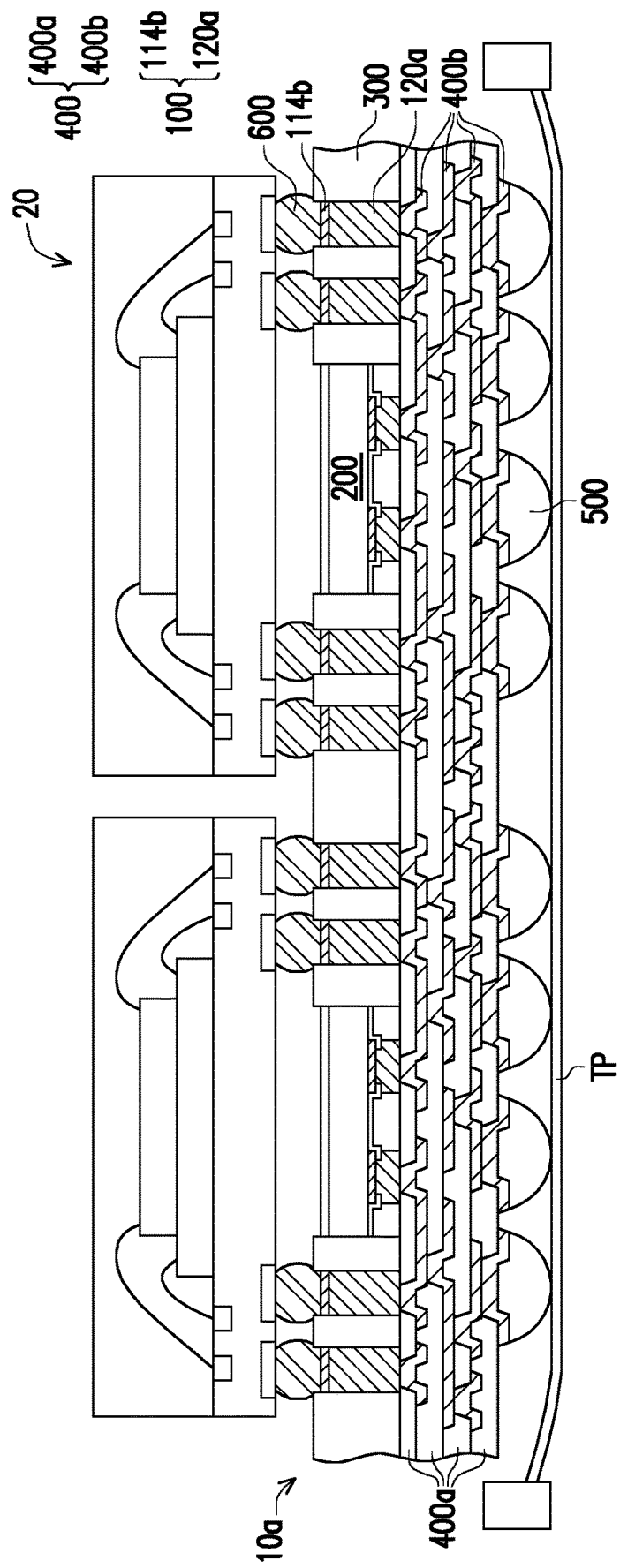
Figure 1R:
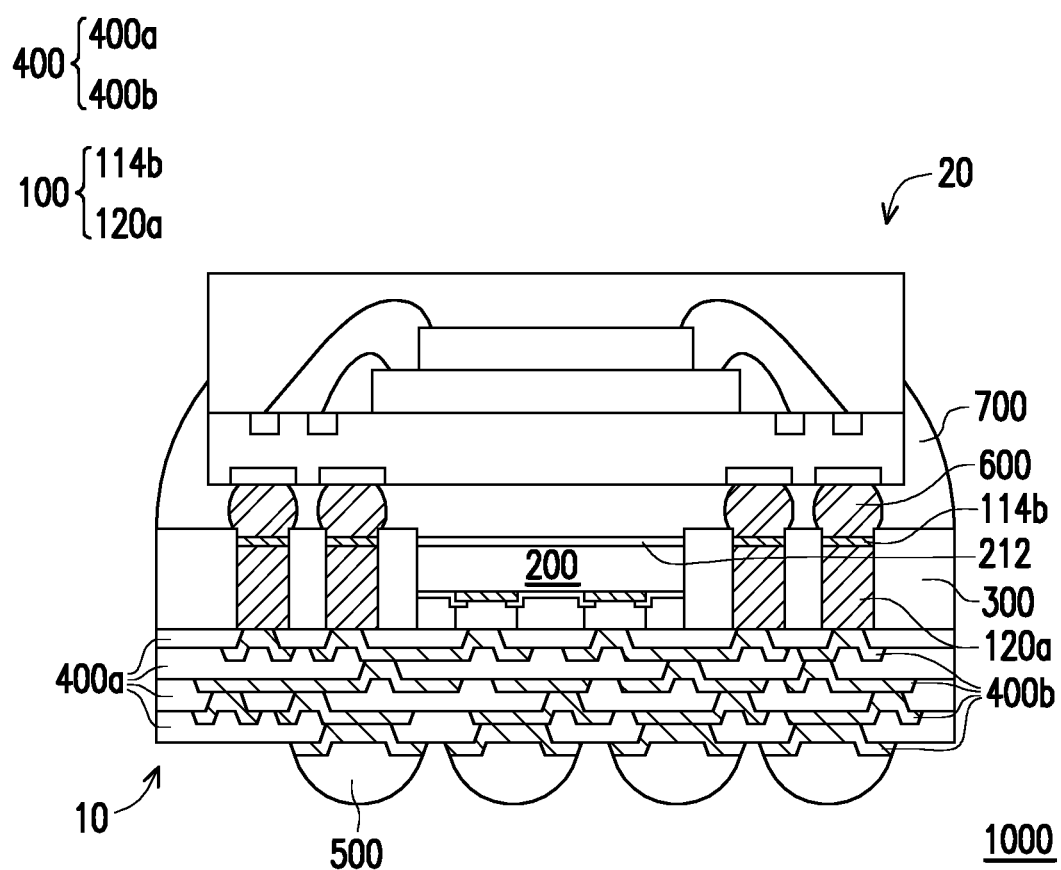

FIG. 1A to FIG. 1R are schematic cross-sectional views illustrating a manufacturing process of a package-on-package (PoP) structure 1000 in accordance with some embodiments of the disclosure. Referring to FIG. 1A, a carrier C having a de-bonding layer DB formed thereon is provided. In some embodiments, the de-bonding layer DB is formed on the top surface of the carrier C. The carrier C is, for example, a glass substrate. On the other hand, in some embodiments, the de-bonding layer DB may be a light-to-heat conversion (LTHC) release layer formed on the glass substrate. In some alternative embodiments, the de-bonding layer may be made of glue or polymer-based materials. However, the materials of the carrier C and the de-bonding layer DB listed above are merely for exemplary illustration, and the disclosure is not limited thereto. In some alternative embodiments, other materials may be adapted as the carrier C as long as the said material is able to withstand the subsequent process while carrying/supporting the subsequently formed elements. Similarly, other materials may be adapted as the de-bonding layer DB as long as the material is able to perform the release function in the subsequent processes.

Referring to FIG. 1B, a seed material layer 110a is formed on the de-bonding layer DB. In some embodiments, the seed material layer 110a may be a composite layer formed by different materials. For example, the seed material layer 110a may include a first sub-layer 112a and a second sub-layer 114a. In some embodiments, the second sub-layer 114a is formed over the first sub-layer 112a. For example, the first sub-layer 112a is sandwiched between the de-bonding layer DB and the second sub-layer 114a. In some embodiments, a material of the first-sub layer 112a may include titanium, titanium nitride, tantalum, tantalum nitride, other suitable materials, or a combination thereof. On the other hand, a material of the second sub-layer 114a may include, for example, copper, copper alloys, or other suitable choice of materials. In some embodiments, the first sub-layer 112a and the second sub-layer 114a are formed by physical vapor deposition or other applicable methods. The first sub-layer 112a may have a thickness of approximately 0.01 µm to approximately 1 µm. On the other hand, a thickness of the second sub-layer 114a may also range between about 0.01 µm to about 1 µm.

Referring to FIG. 1C, a mask M is formed over the seed material layer 110a. The mask M is patterned to render a plurality of openings OP. In some embodiments, the openings OP expose the intended locations for the subsequently formed conductive structures 100' (shown in FIG. 1F). In some embodiments, the openings OP of the mask M expose a portion of the seed material layer 110a. For example, the mask M exposes a portion of the second sub-layer 114a. In some embodiments, the mask M may be formed by a photosensitive material. For example, the mask M may be a photoresist or a dry film.

Referring to FIG. 1D, a conductive material 120' is filled into the openings OP of the mask M. In some embodiments, the conductive material 120' is formed on the portion of the second sub-layer 114a of the seed material layer 110a exposed by the openings OP of the mask M. In some embodiments, the conductive material 120' may be formed by a plating process. The plating process is, for example, electro-plating, electroless-plating, immersion plating, or the like. The conductive material 120' is, for example, copper, copper alloys, or the like. In other words, the second sub-layer 114a of the seed material layer 110a and the conductive material 120' may be made of the same material. However, the disclosure is not limited thereto. In some alternative embodiments, the second sub-layer 114a and the conductive material 120' may include different materials.

Referring to FIG. 1D and FIG. 1E, the mask M is subsequently removed to obtain a plurality of conductive patterns 120a on top of the seed material layer 110a. In some embodiments, the mask M may be removed through a stripping process, an etching process, and/or a cleaning process. Since the conductive patterns 120a are formed by filling the conductive material 120' into the openings OP of the mask M, the conductive patterns 120a may have the same contour as the openings OP of the mask M.

Referring to FIG. 1E and FIG. 1F, the seed material layer 110a is patterned to form a seed layer 110b. As illustrated in FIG. 1F, the seed layer 110b may be constituted by a plurality of seed layer patterns corresponding to the conductive patterns 120a. The patterning of the seed material layer 110a will be described below.

In some embodiments, portions of the second sub-layer 114a exposed by the conductive patterns 120a are selectively removed through a first etching process. In some embodiments, the first etching process may include an anisotropic etching process such as dry etch or an isotropic etching process such as wet etch. In some embodiments, argon (Ar) gas, nitrogen ($N_2$) gas, oxygen ($O_2$) gas, tetrafluoromethane ($CF_4$) gas, or a combination thereof may be adapted as an etchant for dry etch. In some alternative embodiments, hydrogen fluoride (HF) solution, phosphoric acid ($H_3PO_4$) solution, hydrogen peroxide ($H_2O_2$) solution, ammonium hydroxide ($NH_4OH$) solution, or a combination thereof may be adapted as an etchant for wet etch. The first etching process removes portions of the second sub-layer 114a to form a second sub-layer 114b. It is noted that the etchant listed above are merely for exemplary illustration, and other types of etchants may also be adapted as an etchant to etch the second sub-layer 114a.

After removal of portions of the second sub-layer 114a, portions of the first sub-layer 112a is exposed by the conductive patterns 120a and the remaining second sub-layer 114b. The exposed portion of the first sub-layer 112a may be removed through a second etching process. In some embodiments, the first sub-layer 112a may be etched through a dry etching process or a wet etching process to obtain a first sub-layer 112b. The etchant for removing the first sub-layer 112a may include fluorine-based gases such as tetrafluoromethane ($CF_4$) gas, fluoroform ($CHF_3$) gas, other suitable gases, or a combination thereof. In some alternative embodiments, the etchant for removing the first sub-layer 112a may include hydrogen fluoride (HF) solution or other suitable etching solutions. It is noted that the etchant listed above are merely for exemplary illustration, and other types of etchants may also be adapted as an etchant to etch the first sub-layer 112a.

In some embodiments, the conductive patterns 120a and the seed layer 110b (including the first sub-layer 112b and the second sub-layer 114b) may be collectively referred to as conductive structures 100'. In other words, as illustrated in FIG. 1F, the conductive structures 100' are formed on the de-bonding layer DB. In some embodiments, each of the conductive structures 100' includes a seed layer 110b attached to the de-bonding layer DB. For example, the seed layer 110b of the conductive structures 100' is in direct contact with the de-bonding layer DB.

Referring to FIG. 1G, a plurality of dies 200 are placed over the de-bonding layer DB. In some embodiments, the dies 200 are positioned between the conductive structures 100'. For example, the dies 200 are arranged in an array and are surrounded by the conductive structures 100'. In some embodiments, each die 200 has a top surface 200a and a rear surface 200b opposite to the top surface 200a. As illustrated in FIG. 1G, the dies 200 are placed such that the top surfaces 200a face upward while the rear surfaces 200b face the de-bonding layer DB. In some embodiments, the dies 200 are placed over the de-bonding layer DB through a pick-and-place process. In some embodiments, each die 200 may be a memory die (i.e. DRAM, SRAM, NVRAM, and/or the like), a logic die, a radio frequency (RF) die, or a processor die (i.e. accelerated processor (AP)). The configuration of each die 200 will be described below.

In some embodiments, each die 200 includes a semiconductor substrate 202, a plurality of conductive pads 204, a passivation layer 206, a plurality of conductive vias 208, a protection layer 210, and an amorphous layer 212. In some embodiments, the semiconductor substrate 202 may be a silicon substrate. In some alternative embodiments, the semiconductor substrate 202 may be made of a suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. In some embodiments, the semiconductor substrate 202 includes active components (e.g., transistors or the like) and passive components (e.g., resistors, capacitors, inductors, or the like) formed therein.

In some embodiments, the conductive pads 204 are distributed over the semiconductor substrate 202. The conductive pads 204 may be aluminum pads, copper pads, or other suitable metal pads. The passivation layer 206 is formed over the semiconductor substrate 202 and has contact openings partially exposing the conductive pads 204. The passivation layer 206 may be a silicon oxide layer, a silicon nitride layer, a silicon oxynitride layer, or a dielectric layer formed by other suitable dielectric materials. In some embodiments, a post-passivation layer (not shown) may be further formed over the passivation layer 206. In addition, the conductive vias 208 are formed on the conductive pads 204. In some embodiments, the conductive vias 208 are plated on the conductive pads 204 such that the conductive vias 208 are electrically connected to the conductive pads 204. The conductive vias 208 may be copper vias or other suitable metal vias. The protection layer 210 is formed on the passivation layer 206 to cover the conductive vias 208. In some embodiments, the protection layer 210 may be a polybenzoxazole (PBO) layer, a polyimide (PI) layer, or layers made of other suitable polymers. In some alternative embodiments, the protection layer 210 may be made of inorganic materials.

In some embodiments, a thinning process is performed on each die 200 before the dies 200 are placed over the de-bonding layer DB. For example, a back-side grinding process may be performed on the rear surface 200b of each die 200 to reduce the overall thickness of the die 200. During the thinning process, portions of the semiconductor substrate 202 are grinded. The stress generated during the grinding process may disrupt the crystal lattice of portions of the semiconductor substrate 202 located on the grinding surface, thereby forming the amorphous layer 212 on the rear surface 200b of the die 200. As illustrated in FIG. 1G, the amorphous layer 212 is located on the semiconductor substrate 202 opposite to the conductive pads 204. In some embodiments, the amorphous layer 212 is directly in contact with the semiconductor substrate 202 and covers the semiconductor substrate 202. In some embodiments, when the semiconductor substrate 202 is a silicon substrate, the amorphous layer 212 may be an amorphous silicon layer. On the other hand, when the semiconductor substrate 202 includes other types of semiconductors, the amorphous layer 212 may be other types of amorphous semiconductor layers. In some embodiments, a thickness $T_{212}$ of the amorphous layer 212 ranges between about 1 nm and about 300 nm. On the other hand, a thickness $T_{200}$ of the die 200 ranges between about 40 μm and about 250 μm. In some embodiments, a ratio of the thickness $T_{212}$ of the amorphous layer 212 to the thickness $T_{200}$ of the die 200 ranges between about 1:133.3 and about 1:250000.

In some embodiments, the dies 200 are adhered to the de-bonding layer DB through an adhesive layer AD. In some embodiments, the amorphous layer 212 located on the rear surface 200b of the die 200 is attached to the adhesive layer AD. For example, the amorphous layer 212 may be directly in contact with the adhesive layer AD such that the adhesive layer AD is sandwiched between the amorphous layer 212 and the de-bonding layer DB. In some embodiments, the adhesive layer AD may include a die attach film (DAF). However, the disclosure is not limited thereto. In some alternative embodiments, other materials may be adapted as the adhesive layer AD as long as the said material is able to strengthen the adhesion between the die 200 and the de-bonding layer DB.

Referring to FIG. 1H, an encapsulation material 300' is formed on the de-bonding layer DB to encapsulate the conductive structures 100' and the die 200. In some embodiments, the encapsulation material 300' is a molding compound, a molding underfill, a resin (such as epoxy), or the like. The encapsulation material 300' may be formed by a molding process, such as a compression molding process. In some embodiments, a top surface 300a' of the encapsulation material 300' is located at a level height higher than the top surfaces 200a of the die 200 and top surfaces 100a' of the conductive structures 100'. In other words, the conductive structures 100' and the protection layer 210 of each die 200 are not revealed and are well protected by the encapsulation material 300'.

Referring to FIG. 1H and FIG. 1I, the encapsulation material 300' and the protection layer 210 of the dies 200 are grinded until the top surface 100a' of the conductive structures 100' and top surfaces of the conductive vias 208 of the die 200 are exposed. After the encapsulation material 300' is grinded, an encapsulant 300 is formed over the de-bonding layer DB to encapsulate the conductive structures 100' and the die 200. The encapsulant 300 exposes at least part of each die 200 and at least part of each conductive structure 100'. In some embodiments, the encapsulant material 300' is grinded by a mechanical grinding, a chemical mechanical polishing (CMP), or another suitable mechanism. During the grinding process, portions of the protection layer 210 are also grinded to reveal the conductive vias 208, thereby forming a protection layer 210a. In some embodiments, during the grinding process of the encapsulation material 300' and the protection layer 210, portions of the conductive structures 100' and/or portions of the conductive vias 208 may be slightly grinded as well. After grinding, each die 200 has an active surface 200c opposite to the rear surface 200b. The exposed portion of the conductive vias 208 is located on the active surface 200c of the die 200. It is noted that the top surfaces 100a' of the conductive structures 100', a top surface 300a of the encapsulant 300, and the active surfaces 200c of the dies 200 are substantially coplanar with each other.

Referring to FIG. 1J, a redistribution structure 400 is formed over the conductive structures 100', the dies 200, and the encapsulant 300. In some embodiments, the redistribution structure 400 is formed on the top surfaces 100a' of the conductive structures 100', the active surfaces 200c of the dies 200, and the top surface 300a of the encapsulant 300 to electrically connect with the conductive structures 100' and the dies 200. As illustrated in FIG. 1J, the redistribution structure 400 includes a plurality of inter-dielectric layers 400a and a plurality of redistribution conductive patterns 400b stacked alternately. The redistribution conductive patterns 400b are electrically connected to the conductive vias 208 of the dies 200 and the conductive structures 100' embedded in the encapsulant 300. In some embodiments, the bottommost inter-dielectric layer 400a partially covers the top surfaces of the conductive vias 208 and the top surfaces 100a' of the conductive structures 100' to form a plurality of contact openings. The bottommost redistribution conductive patterns 400b extend into the contact openings of the bottommost inter-dielectric layer 400 to be in physical contact with the top surfaces of the conductive vias 208 and the top surfaces 100a' of the conductive structures 100'. As illustrated in FIG. 1J, the topmost redistribution conductive patterns 400b include a plurality of pads. In some embodiments, the aforementioned pads may include a plurality of under-ball metallurgy (UBM) patterns for ball mount. In some alternative embodiments, the aforementioned pads may further include a plurality of connection pads for mounting passive components.

In some embodiments, a material of the redistribution conductive patterns 400b includes aluminum, titanium, copper, nickel, tungsten, and/or alloys thereof. The redistribution conductive patterns 400b may be formed by, for example, electroplating, deposition, and/or photolithography and etching. In some embodiments, a material of the inter-dielectric layers 400a includes polyimide, epoxy resin, acrylic resin, phenol resin, benzocyclobutene (BCB), polybenzooxazole (PBO), or other suitable polymer-based dielectric materials. The inter-dielectric layers 400a may be formed by suitable fabrication techniques such as spin-on coating, chemical vapor deposition (CVD), plasma-enhanced chemical vapor deposition (PECVD), or the like.

Referring to FIG. 1K, after the redistribution structure 400 is formed, a plurality of conductive terminals 500 are placed on the topmost redistribution conductive patterns 400b (the UBM patterns) of the redistribution structure 400. In some embodiments, the conductive terminals 500 include solder balls. In some embodiments, the conductive terminals 500 may be placed on the UBM patterns through a ball placement process or other suitable processes.

Referring to FIG. 1K and FIG. 1L, after the conductive terminals 500 are formed on the redistribution structure 400, the carrier C is removed. In some embodiments, the removal of the carrier C may be achieved by irradiating the de-bonding layer DB (e.g. the LTHC release layer) with an UV laser such that the carrier C may be peeled off. During the peeling process, a portion of the de-bonding layer DB may stick on the carrier C and may be carried away by the carrier C. Meanwhile, another portion of the de-bonding layer DB remains on the adhesive layer AD, the encapsulant 300, and the conductive structures 100'. After the carrier C is removed, the structure is flipped upside down such that the rear surfaces 200b of the dies 200 face upward. The flipped structure is placed on a tape TP for further processing, as illustrated in FIG. 1L.

In some embodiments, the remaining de-bonding layer DB may be removed to expose the conductive structures 100' for future electrical connection. In some embodiments, the adhesive layer AD may have poor thermal conductivity which would lead to accumulation of heat generated during the operation of the dies 200 within the subsequently formed package 10 (shown in FIG. 1R), thereby compromising the performance and lifetime of the subsequently formed package 10. Therefore, in some embodiments, the adhesive layer AD may be removed to enhance the performance and lifetime of the subsequently formed package 10. In some embodiments, in order to further enhance adhesion between the conductive structures 100' and the subsequently formed elements, the first sub-layer 112b of the seed layer 110b may be removed to expose the second sub-layer 114b. In some embodiments, the removal of the de-bonding layer DB, the adhesive layer AD, and the first sub-layer 112b of the seed layer 110b may be achieved by a hybrid etching process including multiple etching steps. For example, the hybrid etching process may include a dry etching process preceding a wet etching process. The hybrid etching process will be discussed below in conjunction with FIG. 1M to FIG. 1P.

Referring to FIG. 1M and FIG. 1N, a dry etching process DE is performed on the structure illustrated in FIG. 1M to remove the de-bonding layer DB and the adhesive layer AD. In some embodiments, an etchant of the dry etching process DE is free of fluorine compound. For example, the etchant of the dry etching process DE does not include tetrafluoromethane ($CF_4$) gas. On the other hand, the etchant of the dry etching process DE may include argon (Ar) gas, nitrogen ($N_2$) gas, and/or oxygen ($O_2$) gas. It is noted that the etchant listed above are merely for exemplary illustration, and other gases may be adapted as an etchant for the dry etching process DE as long as fluorine compound is not included. In some embodiments, a duration of the dry etching process DE lasts from 10 seconds to 300 seconds. As illustrated in FIG. 1N, the dry etching process DE does not remove the amorphous layer 212 underneath the adhesive layer AD. That is, throughout the dry etching process DE, the semiconductor substrate 202 of each die 200 is covered by the amorphous layer 212. As such, the amorphous layer 212 may serve as a barrier layer to prevent impurities generated during the dry etching process DE from damaging or diffusing into the semiconductor substrate 202, thereby ensuring the reliability of the dies 200.

As illustrated in FIG. 1N, the dry etching process DE removes the adhesive layer AD to form a recess R1 in the encapsulant 300. In some embodiments, the recess R1 exposes the amorphous layer 212 of each die 200. Since the amorphous layer 212 is located in the recess R1, a surface of the amorphous layer 212 (i.e. the rear surface 200b of the die 200) is located at a level height different from a rear surface 300b of the encapsulant 300. For example, the surface of the amorphous layer 212 may be located at a level height lower than the rear surface 300b of the encapsulant 300. That is, a thickness of the encapsulant 300 may be larger than a thickness of the dies 200.

Referring to FIG. 1O and FIG. 1P, after the dry etching process DE, a wet etching process WE is performed on the structure illustrated in FIG. 1O to remove a portion of the seed layer 110b. For example, the first sub-layer 112b of the seed layer 110b may be removed by the wet etching process WE. In some embodiments, an etchant of the wet etching process WE includes hydrogen fluoride (HF) solution, phosphoric acid ($H_3PO_4$) solution, hydrogen peroxide ($H_2O_2$) solution, ammonium hydroxide ($NH_4OH$) solution, or a combination thereof. It is noted that the etchant listed above are merely for exemplary illustration, and other solutions may be adapted as an etchant for the wet etching process WE. As illustrated in FIG. 1P, the wet etching process WE does not remove the exposed amorphous layer 212. That is, throughout the wet etching process WE, the semiconductor substrate 202 of each die 200 is covered by the amorphous layer 212. As such, the amorphous layer 212 may serve as a barrier layer to prevent metallic impurities (such as copper or titanium in the seed layer 110a) generated during the wet etching process WE from damaging or diffusing into the semiconductor substrate 202. As such, the copper-in-fin issue in which copper compounds are diffused into the semiconductor substrate 202 may be eliminated, and the reliability of the dies 200 may be ensured.

As illustrated in FIG. 1P, a package array 10a is obtained after performing the hybrid etching process. In some embodiments, after the hybrid etching process, the amorphous layer 212 still remains on the rear surface 200b of each die 200 to cover the semiconductor substrate 202. As illustrated in FIG. 1P, the wet etching process WE removes the first sub-layer 112b of the seed layer 110a to form a recess R2 in the encapsulant 300. In some embodiments, the recess R2 exposes the second sub-layer 114b of the seed layer 110b. In some embodiments, the second sub-layer 114b of the seed layer 110b and the conductive patterns 120a constitute a plurality of conductive structures 100. Since the second sub-layer 114b of the seed layer 110b is located in the recess R2, rear surfaces 100b of the conductive structures 100 are located at a level height different from a rear surface 300b of the encapsulant 300. For example, the rear surfaces 100b of the conductive structures 100 may be located at a level height lower than the rear surface 300b of the encapsulant 300. It is noted that although the rear surfaces 100b of the conductive structures 100, the rear surfaces 200b of the dies 200, and the rear surface 300b of the encapsulant 300 are illustrated as located at different level heights, the disclosure is not limited thereto. In some alternative embodiments, during the hybrid etching process, a portion of the encapsulant 300 may be removed to render different configurations. The different configurations will be discussed below in conjunction with FIG. 2A and FIG. 2B.

Figure 2A:
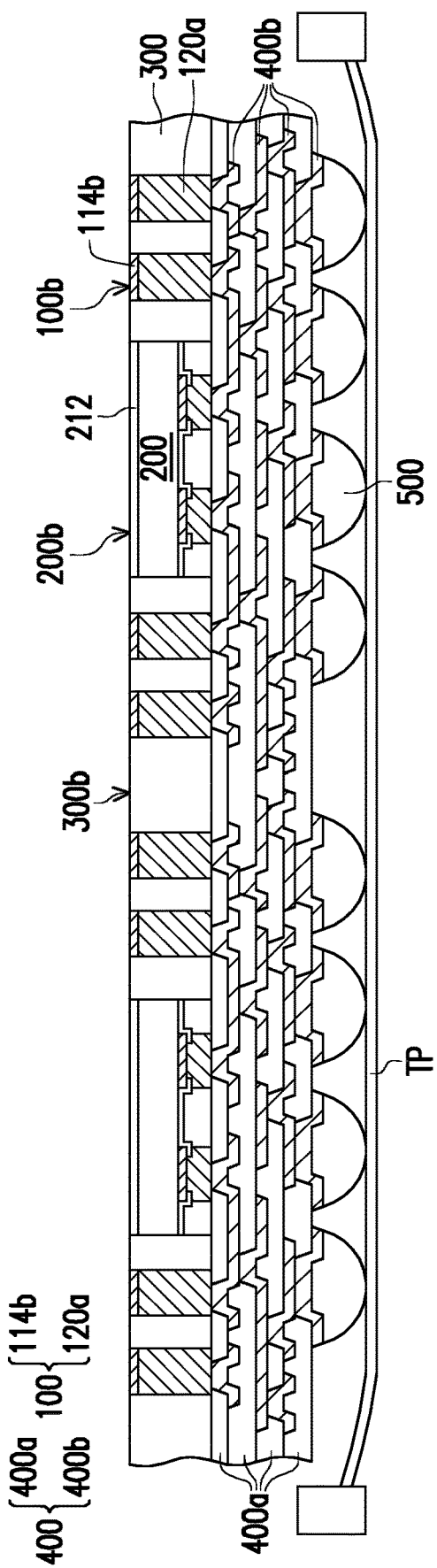
FIG. 2A is a schematic cross-sectional view illustrating an intermediate stage of a manufacturing process of a PoP structure in accordance with some alternative embodiments of the disclosure.

FIG. 2A is a schematic cross-sectional view illustrating an intermediate stage of a manufacturing process of a PoP structure 1000 in accordance with some alternative embodiments of the disclosure. Referring to FIG. 2A, during the dry etching process DE and/or the wet etching process WE, a portion of the encapsulant 300 may be etched. As a result, the rear surfaces 100b of the conductive structures 100 and/or the rear surfaces 200b of the dies 200 may be substantially coplanar with the rear surface 300b of the encapsulant 300. That is, a thickness of the encapsulant 300 may be substantially equal to a thickness of the dies 200.

Figure 2B:
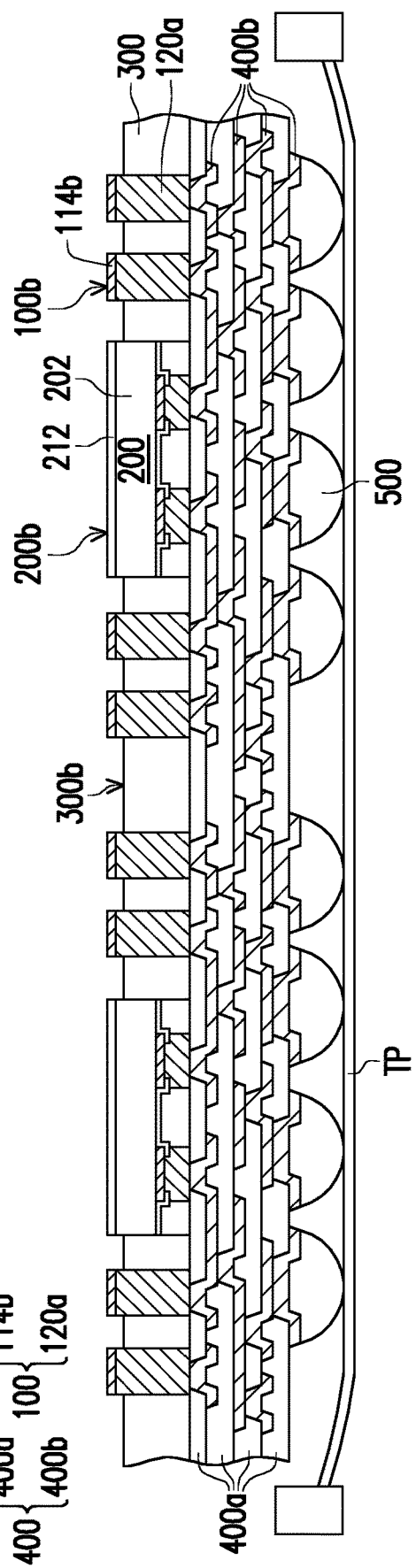
FIG. 2B is a schematic cross-sectional view illustrating an intermediate stage of a manufacturing process of a PoP structure in accordance with some alternative embodiments of the disclosure.

FIG. 2B is a schematic cross-sectional view illustrating an intermediate stage of a manufacturing process of a PoP structure 1000 in accordance with some alternative embodiments of the disclosure. Referring to FIG. 2B, during the dry etching process DE and/or the wet etching process WE, a portion of the encapsulant 300 may be etched. As a result, the rear surfaces 300b of the encapsulant 300 may be located at a level height different from the rear surfaces 200b of the dies 200 and the rear surfaces 100b of the conductive structures 100. For example, the rear surface 300b of the encapsulant 300 may be located at a level height lower than the rear surfaces 200b of the dies 200 and the rear surfaces 100b of the conductive structures 100. That is, a thickness of the encapsulant 300 may be smaller than a thickness of the dies 200.

It is noted that the steps illustrated in FIG. 1M to FIG. 1P are merely an exemplary illustration of the hybrid etching process, and the disclosure is not limited thereto. In some alternative embodiments, the hybrid etching process may include different steps. Another exemplary hybrid etching process for removing the de-bonding layer DB, the adhesive layer AD, and the first sub-layer 112b of the seed layer 110b will be discussed below in conjunction with FIG. 3A to FIG. 3D.

Figure 3A:
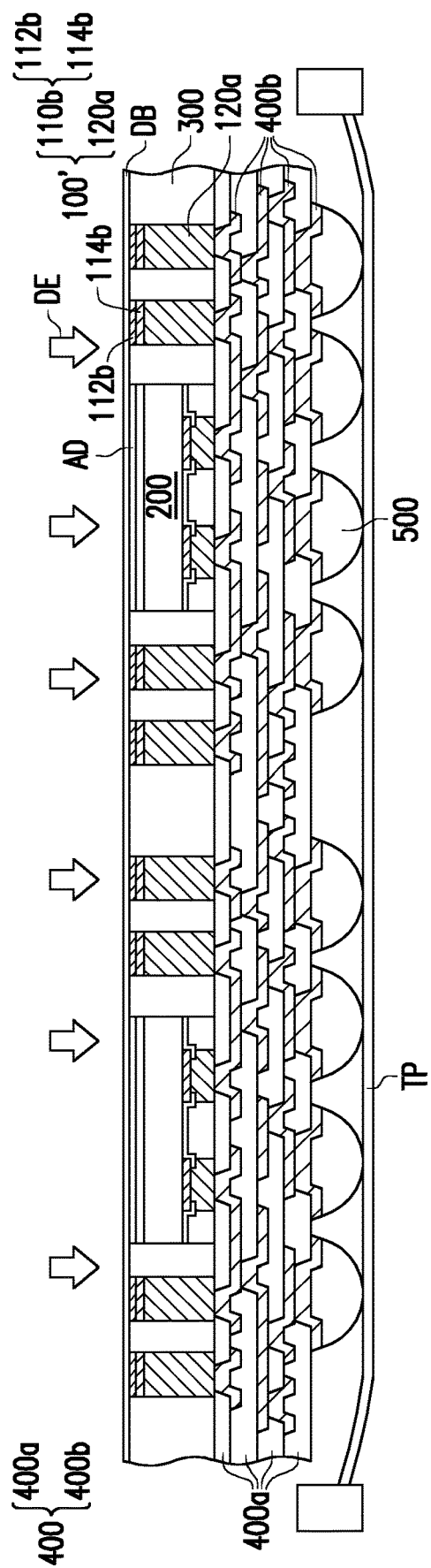
Figure 3B:
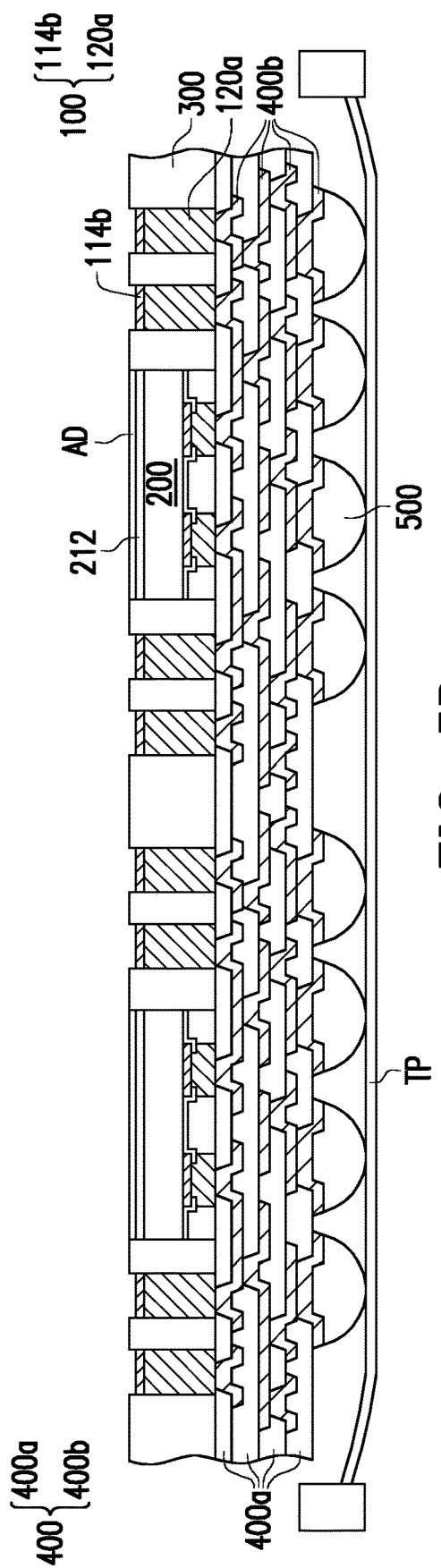

FIG. 3A to FIG. 3D are schematic cross-sectional views illustrating a hybrid etching process of a manufacturing process of a PoP structure 1000 in accordance with some alternative embodiments of the disclosure. Referring to FIG. 3A and FIG. 3B, a dry etching process DE is performed on the structure illustrated in FIG. 3A to remove the de-bonding layer DB and a portion of the seed layer 110b. For example, the de-bonding layer DB and the first sub-layer 112b of the seed layer 110b may be removed by the dry etching process DE. In some embodiments, an etchant of the dry etching process DE includes tetrafluoromethane ($CF_4$) gas. In some embodiments, the etchant of the dry etching process DE may further include argon (Ar) gas, nitrogen ($N_2$) gas, and/or oxygen ($O_2$) gas. It is noted that the etchant listed above are merely for exemplary illustration, and other gases may be adapted as an etchant for the dry etching process DE. In some embodiments, a duration of the dry etching process DE lasts from 10 seconds to 180 seconds. By controlling the duration of the dry etching process DE within the foregoing range, the de-bonding layer DB and the first sub-layer 112b of the seed layer 110b may be sufficiently removed without completely removing the adhesive layer AD. In other words, throughout the dry etching process DE, the semiconductor substrate 202 and the amorphous layer 212 of each die 200 are covered by the adhesive layer AD. As such, the adhesive layer AD and the amorphous layer 212 may serve as a barrier layer to prevent metallic impurities (such as copper or titanium in the seed layer 110a) generated during the dry etching process DE from redepositing or diffusing into the semiconductor substrate 202. As such, the copper-in-fin issue in which copper compounds are diffused into the semiconductor substrate 202 may be eliminated, and the reliability of the dies 200 may be ensured.

Referring to FIG. 3C and FIG. 3D, after the dry etching process DE, a wet etching process WE is performed on the structure illustrated in FIG. 3C to remove the adhesive layer AD. In some embodiments, an etchant of the wet etching process WE includes hydrogen fluoride (HF) solution, phosphoric acid ($H_3PO_4$) solution, hydrogen peroxide ($H_2O_2$) solution, ammonium hydroxide ($NH_4OH$) solution, or a combination thereof. It is noted that the etchant listed above are merely for exemplary illustration, and other solutions may be adapted as an etchant for the wet etching process WE. As illustrated in FIG. 3D, after the wet etching process WE, the amorphous layer 212 remains on the rear surfaces 200b of the dies 200. That is, throughout the wet etching process WE, the semiconductor substrate 202 of each die 200 is covered by the amorphous layer 212. As such, the amorphous layer 212 may serve as a barrier layer to prevent impurities generated during the wet etching process WE from damaging or diffusing into the semiconductor substrate 202, thereby ensuring the reliability of the dies 200.

Referring back to FIG. 1Q, after performing the hybrid etching process, a plurality of packages 20 are stacked over the package array 10a. In some embodiments, the package array 10a has a dual-side terminal design to accommodate the packages 20. The packages 20 are, for example, IC packages. The packages 20 are electrically connected to the package array 10a through a plurality of joint terminals 600 sandwiched between the packages 20 and the package array 10a. In some embodiments, the joint terminals 600 are solder joints formed by a ball placement process and/or a reflowing process. It is noted that FIG. 1Q merely serves as an exemplary illustration, and the disclosure is not limited thereto. In some alternative embodiments, other electronic devices such as an integrated fan-out (InFO) package, a memory device, a ball grid array (BGA), or a wafer may be stacked over the package array 10a in place of the packages 20.

Referring to FIG. 1R, the package array 10a is diced or singulated to form a plurality of packages 10 having packages 20 stacked thereon. In some embodiment, the dicing process or the singulation process typically involves dicing with a rotating blade or a laser beam. In other words, the dicing or the singulation process is, for example, a laser cutting process, a mechanical cutting process, or other suitable processes. In some embodiments, the package 10 may be referred to as an InFO package. In some embodiments, an underfill 700 is formed to encapsulate the joint terminals 600. In some embodiments, at least a portion of the underfill 700 is located between the package 10 and the package 20. For example, the underfill 700 may fill the gap between the package 10 and the package 20 such that the underfill 700 is directly in contact with the amorphous layer 212 of the die 200. After the underfill 700 is formed, the PoP structure 1000 is obtained.

In accordance with some embodiments of the disclosure, a package-on-package (PoP) structure includes a first package and a second package stacked on the first package. The first package has a die, a plurality of conductive structures, an encapsulant, and a redistribution structure. The die has an active surface and a rear surface opposite to the active surface. The die includes an amorphous layer located on the rear surface. The conductive structures surround the die. The encapsulant encapsulates the die and the conductive structures. The redistribution structure is on the active surface of the die and is electrically connected to the conductive structures and the die.

In accordance with some embodiments of the disclosure, a method of manufacturing a package includes at least the following steps. A carrier having a de-bonding layer formed thereon is provided. A conductive structure is formed over the de-bonding layer. The conductive structure includes a seed layer attached to the de-bonding layer. A die is attached on the de-bonding layer through an adhesive layer. The die includes an amorphous layer attached to the adhesive layer. The carrier is removed. The de-bonding layer and the adhesive layer are removed to expose the amorphous layer. A portion of the seed layer is removed after removing the de-bonding layer and the adhesive layer.

In accordance with some embodiments of the disclosure, a method of manufacturing a package includes at least the following steps. A carrier having a de-bonding layer formed thereon is provided. A conductive structure is formed over the de-bonding layer. A die is attached on the de-bonding layer through an adhesive layer. The die includes a semiconductor substrate and an amorphous layer covering the semiconductor substrate. The amorphous layer is attached to the adhesive layer. A redistribution structure is formed over the die and the conductive structure. The carrier is removed. A dry etching process is performed to remove the de-bonding layer. A wet etching process is performed to remove the adhesive layer and leaves the amorphous layer to cover the semiconductor substrate of the die after the wet etching process is performed.

In accordance with some alternative embodiments of the disclosure, a package-on-package (PoP) structure includes a first package and a second package stacked on the first package. The first package includes a die, an encapsulant, and a redistribution structure. The die has an active surface and a rear surface opposite to the active surface. The die includes an amorphous layer located on the rear surface. The encapsulant encapsulates the die. A thickness of the die is smaller than a thickness of the encapsulant. The redistribution structure is on the active surface of the die. The redistribution structure is electrically connected to the die.

In accordance with some alternative embodiments of the disclosure, a package-on-package (PoP) structure includes a first package and a second package stacked on the first package. The first package includes a die, a plurality of conductive structures, and an encapsulant. The die has an active surface and a rear surface opposite to the active surface. The die includes an amorphous layer located on the rear surface. The conductive structures surround the die. Each of the conductive structures includes a conductive pattern and a seed layer pattern disposed on the conductive pattern. The encapsulant encapsulates the die and the conductive structures. Top surfaces of the seed layer patterns are located at a level height lower than a top surface of the encapsulant.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package-on-package (PoP) structure, comprising:
   a first package, comprising:
      a die having an active surface and a rear surface opposite to the active surface, wherein the die comprises an amorphous layer located on the rear surface;
      a plurality of conductive structures surrounding the die;
      an encapsulant encapsulating the die and the plurality of conductive structures; and
      a redistribution structure on the active surface of the die, wherein the redistribution structure is electrically connected to the plurality of conductive structures and the die; and
   a second package stacked on the first package.

2. The PoP structure according to claim 1, wherein the amorphous layer comprises an amorphous silicon layer.

3. The PoP structure according to claim 1, wherein a ratio of a thickness of the amorphous layer to a thickness of the die ranges between about 1:133.3 and about 1:250000.

4. The PoP structure according to claim 1, wherein a thickness of the amorphous layer ranges between about 1 nm and about 300 nm.

5. The PoP structure according to claim 1, wherein a surface of the amorphous layer is substantially coplanar with a surface of the encapsulant.

6. The PoP structure according to claim 1, wherein a surface of the amorphous layer is located at a different level height from a surface of the encapsulant.

7. The PoP structure according to claim 1, further comprising a plurality of conductive terminals on the redistribution structure.

8. The PoP structure according to claim 1, further comprising:
   a plurality of joint terminals sandwiched between the first package and the second package; and
   an underfill encapsulating the plurality of joint terminals.

9. The PoP structure according to claim 8, wherein the underfill is in direct contact with the amorphous layer.

10. A package-on-package (PoP) structure, comprising:
    a first package, comprising:
       a die having an active surface and a rear surface opposite to the active surface, wherein the die comprises an amorphous layer located on the rear surface;
       an encapsulant encapsulating the die, wherein a thickness of the die is smaller than a thickness of the encapsulant; and
       a redistribution structure on the active surface of the die, wherein the redistribution structure is electrically connected to the die; and
    a second package stacked on the first package.

11. The PoP structure according to claim 10, wherein the amorphous layer comprises an amorphous silicon layer.

12. The PoP structure according to claim 10, further comprising a plurality of conductive structures surrounding the die, wherein a thickness of the plurality of conductive structures is smaller than the thickness of the encapsulant.

13. The PoP structure according to claim 10, further comprising:
    a plurality of joint terminals sandwiched between the first package and the second package; and
    an underfill encapsulating the plurality of joint terminals.

14. The PoP structure according to claim 13, wherein the underfill is in direct contact with the amorphous layer and the encapsulant.

15. A package-on-package (PoP) structure, comprising:
a first package, comprising:
- a die having an active surface and a rear surface opposite to the active surface, wherein the die comprises an amorphous layer located on the rear surface;
- a plurality of conductive structures surrounding the die, wherein each of the plurality of conductive structures comprises a conductive pattern and a seed layer pattern disposed on the conductive pattern; and
- an encapsulant encapsulating the die and the plurality of conductive structures, wherein top surfaces of the seed layer patterns are located at a level height lower than a top surface of the encapsulant; and a second package stacked on the first package.

16. The PoP structure according to claim 15, wherein sidewalls of each seed layer pattern are aligned with sidewalls of the corresponding conductive pattern.

17. The PoP structure according to claim 15, wherein the amorphous layer comprises an amorphous silicon layer.

18. The PoP structure according to claim 15, wherein a top surface of the amorphous layer is located at a different level height from the top surface of the encapsulant.

19. The PoP structure according to claim 15, further comprising:
- a plurality of joint terminals sandwiched between the first package and the second package, wherein the plurality of joint terminals is directly in contact with the top surfaces of the seed layer patterns; and
- an underfill encapsulating the plurality of joint terminals.

20. The PoP structure according to claim 15, further comprising:
- a redistribution structure on the active surface of the die, wherein the redistribution structure is electrically connected to the plurality of conductive structures and the die; and
- a plurality of conductive terminals on the redistribution structure.

* * * * *